United States Patent [19]

Acker

[11] 3,736,520

[45] May 29, 1973

[54] PRECISION VARIABLE GAIN AMPLIFIER WITH LINEAR LOG-GAIN VERSUS CONTROL-VOLTAGE CHARACTERISTIC

[75] Inventor: William F. Acker, Seminole, Fla.

[73] Assignee: Honeywell Information Systems Inc., Waltham, Mass.

[22] Filed: Nov. 23, 1971

[21] Appl. No.: 201,459

[52] U.S. Cl. ......................330/29, 330/86, 330/110, 330/134, 330/145

[51] Int. Cl. ..............................................H03g 3/30

[58] Field of Search..........................330/29, 86, 110, 330/145, 134

[56] References Cited

UNITED STATES PATENTS

| | | | |
|---|---|---|---|
| 3,582,807 | 6/1971 | Addis | 330/145 |
| 3,600,589 | 8/1971 | Hanson | 330/110 X |
| 3,098,199 | 7/1963 | Carney et al. | 330/86 X |

*Primary Examiner*—Roy Lake
*Assistant Examiner*—James B. Mullins
*Attorney*—Nicholas Prasinos, Ronald T. Reiling and Fred Jacob

[57] ABSTRACT

A precision variable gain amplifier with linear log-gain versus control-voltage characteristic having an automatically adjusted input diode bias current proportional to the nominal input signal level. A fixed bias current is supplied to the output diode where the AGC (automatic gain control) keeps the nominal signal level constant. Input bias and input signal currents are applied through the input diode, transformed to a voltage in accordance with the logarithmic forward current-voltage characteristic of the diode, a fixed bias voltage which is proportional to the AGC signal control-voltage is subtracted from the logarithmic diode voltage and this differential voltage is applied across the output diode, the antilogarithmic voltage-current characteristic of the diode transforms this voltage into a current linearly proportional to the bias and signal currents in the input diode, this current is converted to a voltage which appears at the output of the variable gain amplifier, the output signal is applied to an integrator which adjusts the bias current through the input diode in such a manner as to drive the d-c bias of the output signal toward zero.

20 Claims, 1 Drawing Figure

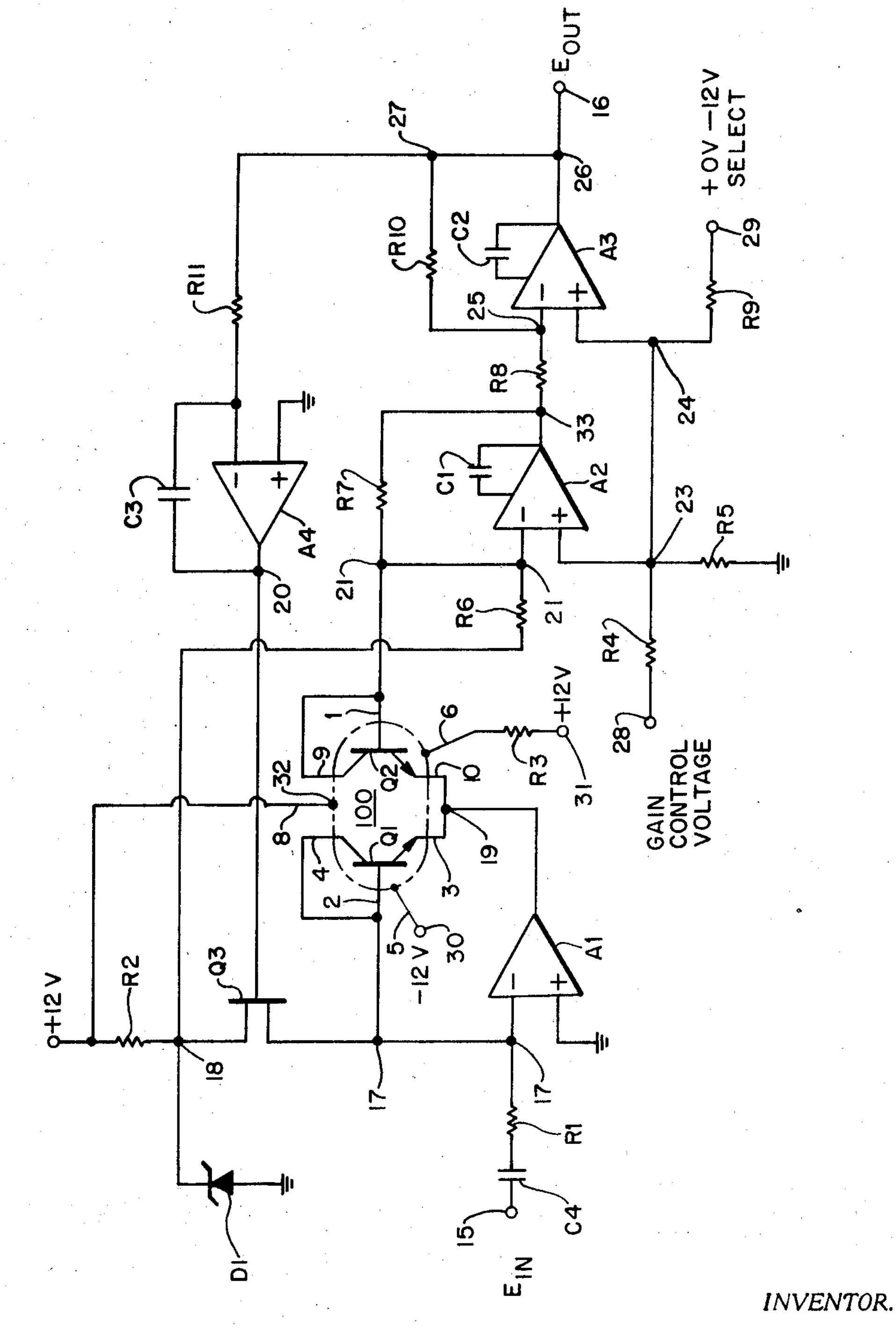
INVENTOR.
WILLIAM F. ACKER
BY *Nicholas Prasinos*
ATTORNEY

PRECISION VARIABLE GAIN AMPLIFIER WITH LINEAR LOG-GAIN VERSUS CONTROL-VOLTAGE CHARACTERISTIC

BACKGROUND OF THE INVENTION

1. Field of the Invention

This invention relates generally to variable gain amplifiers and more particularly to precision variable gain amplifiers having linear log-gain versus control-voltage characteristics.

2. Description of Prior Art

In measuring the amplitude of an input signal it is first necessary to amplify it, but its range variation may be so large that if it is amplified too much the saturation condition is reached, whereas if it is amplified too little, precision measurements are difficult to make. What is needed is a technique for amplifying the input signal by a variable amount, until it is of a standard size where it may be easily measured.

One technique for measuring an input signal is to apply a signal in the front end of the amplifier, adjust the gain of the amplifier until the output is a standard size, and then measure the amplifier gain required for accomplishing this change which then can be utilized for indicating the size of the input signal.

It is known how to obtain variable gain in an amplifier by making use of the well-known fact that when the forward current through a semiconductor diode is changed, the change in voltage across the diode is proportional to the logarithm of the ratio of the two currents e.g. at room temperature a decade increase in forward current produces a voltage increase of about 61 millivolts.

One technique for utilizing this well-known fact would produce a voltage across the base emitter of a diode, which voltage would be proportional to the log of the input voltage, then a constant voltage proportional to the desired gain change (approximately equal to 61 millivolts per decade) would be added or subtracted, and finally the antilog of this sum would be obtained. The flaw in this technique is that the log of zero is minus infinity; however, when the diode current goes to zero the voltage does not go to minus infinity. The a-c coupled input voltage to the amplifier not only goes to zero but it is negative half of the time. Since the current to the diode varies proportionately to the input voltage, or can be made to vary thus by means of an appropriate input resistor between the input and the diode, for negative input voltages the current through the diode would also go to zero and would cut off the diode. To prevent the current through the diode processor from going to zero, a constant positive bias current, slightly larger than the largest negative signal current expected during the extreme negative swing of the input signal $E_{in}$, is added. Although this concept affords a technique for preventing the processing diode from cutting off during zero or negative swings of the input AC signal, it is not sufficient to produce an accurate wide dynamic range circuit. It was still necessary to find a way to adjust the bias current itself proportionally to the input signal level, because too small a bias current causes the diode processor current to go to zero distorting the negative peaks of the input signal, whereas too large a bias causes the desired diode voltage variations to be so small that the desired signal is lost in noise. There was still another problem with this technique in that it was necessary to find a way to remove the inserted bias before the desired signal reached the output of the amplifier. The instant invention adds a fixed bias at the *output* of the processing diode and then adjusts the input bias to cancel the output bias.

SUMMARY OF THE INVENTION

Briefly, the instant invention herein discloses an apparatus and a method for automatically adjusting the bias current of a precision variable gain amplifier proportionally to the input signal level. A fixed bias is added at the output of an equivalent semiconductor (processing) diode means and a variable bias at the input, and then the input bias is varied to cancel the output bias. The bias level at the output is made slightly greater than the saturation voltage of the output stage so that the output stage can be driven to its full swing before the bias is overcome. An Automatic Gain Control (AGC) voltage is adjusted to keep the output signal level below the saturation level of the processing diode means; therefore, the signal level will not exceed the bias level at the output stage. Since the bias and the signal are both amplified the same amount, keeping the signal below the bias level at the output assures that the signal will be smaller than the bias level at the input of the processing diode means also. The result of this feedback bias adjustment system is that, as the AGC voltage is adjusted to hold the output signal amplitude constant, the input bias level is automatically adjusted to be proportional to the input signal amplitude.

The circuit in summary comprises equivalent semiconductor diode means having a forward voltage versus current characteristic curves such that a change in voltage across the equivalent processing diode means is proportional to the logarithm of the ratio of the current after the change relative to the current before the change.

The equivalent diode means further comprise first and second equivalent semiconductor diodes (transistors) having their emitters coupled together. The base of the first semiconductor diode means is maintained at ground potential. Output-bias-voltage means apply a bias voltage to the base of the second semiconductor diode such that the bias voltage is a constant voltage proportional to the applied AGC control voltage.

Signal-input means and input-bias current means apply an incoming signal current and a bias current respectively through the input diode. The emitter terminals of the first and second semiconductor diodes are connected together and therefore are at the same potential with respect to ground. However because the base of the first diode is maintained at ground and the base of the second diode has a bias voltage proportional to the AGC control voltage, the emitter to ground or emitter to base voltage of the first diode varies proportionately to the log of the input bias current plus the input signal current; whereas, the voltage across the emitter to base of the second diode is proportional to the AGC voltage plus the log of the sum of the input bias current and the input signal current. Since the current through the base-emitter junction of the second diode varies proportionately with the antilogarithm of the base-emitter voltage, the current through the second diode is proportional to the sum of the input bias current and signal current amplitudes times the antilogarithm of the AGC voltage.

The current through the second diode is subtracted from the fixed bias current supplied by the output bias means, and the difference current is applied to the input of an amplifier, which has a large enough gain-bandwidth-product to assure dependable high-frequency operation, and the amplified difference signal is converted to a voltage signal which is integrated and then fed back to the input bias means.

OBJECTS

It is an object, therefore, of the instant invention to provide an improved variable gain amplifier.

It is a further object of the invention to provide a precision variable gain amplifier for amplifying AC input signals.

It is yet a further object of the invention to provide a variable gain amplifier that adjusts the bias current itself, proportionally to the input signal level.

It is still a further object of the instant invention to provide a high precision variable gain amplifier having a fixed bias applied at the output and a variable input bias, and adjusting the input bias to cancel the output bias.

Another object of the invention is to provide a precision variable gain amplifier having a linear log-gain versus control-voltage characteristic.

These and other objects and advantages of the invention will become apparent from the following description of the preferred embodiment of the invention when read in conjunction with the drawings contained herewith.

BRIEF DESCRIPTION OF THE DRAWINGS

FIG. 1 is a schematic diagram of a preferred embodiment of the invention. DESCRIPTION OF A PREFERRED EMBODIMENT Referring now to FIG. 1 a temperature stabilized transistor pair is denoted generally as 100 and is shown enclosed by a dash-dot line. Typically the circuit shown enclosed by dash-dot lines in FIG. 1 may be found and described in pages 89–94 in the "Fairchild Semiconductor Linear Integrated Circuits Applications Handbook" written and edited by James N. Giles and published in 1967. This circuit is denoted as $\mu$ A726 and is available commercially from Fairchild Semiconductor Corporation although similar circuits of other manufacturers may be used. The temperature stabilized transistor pair Q1 and Q2 for the purposes of this invention comprise two transistors Q1 and Q2 with the collector of each transistor coupled to its own base. This connection makes each transistor Q1 and Q2 an effective diode. Hence, for the purposes of this invention each of transistors Q1 and Q2 will be referred to as an effective diode or a processing diode. The emitters of transistors Q1 and Q2 are coupled to each other which in turn are coupled to the output of amplifier A1. Type LM107 operational amplifiers commercially available from National Semiconductor Corporation may be used for amplifiers A1 and A4 although other types made by other manufacturers may also be used. The positive input terminal of amplifier A1 is grounded whereas the negative input terminal of amplifier A1 is coupled through resistor R1 to input terminal 15 for applying input signal $E_{in}$. The base terminal 2 of transistor Q1 is coupled to the collector terminal 4 of transistor Q1, and moreover the base terminal 2 of transistor Q1 is coupled to the negative (inverting) input terminal of amplifier A1 through junction point 17. The base terminal 1 of transistor Q2 is coupled to the collector terminal 9 of transistor Q2. The base terminal 1 of transistor Q2 is also coupled to the negative input or summing terminal of operational amplifier A2 through junction point 21. (Operational amplifiers are described in the above reference "Fairchild Semiconductor Linear Integrated Circuits Applications Handbook" on pages 17–25. An LM101A operational amplifier commercially available from National Semiconductor Corporation may be used for operational amplifier A2 although other types available from other manufacturers may also be used.) The base terminal 1 of transistor Q2 is also coupled to feedback resistor R7 of operational amplifier A2. Feedback resistor R7 is moreover coupled to the negative input and also to the output of operational amplifier A2 via junction points 21 and 33, respectively. A zener diode D1 has its anode grounded and its cathode is coupled to one terminal of resistor R6 whose other terminal is coupled to the negative input terminal of operational amplifier A2. The positive input terminal of operational amplifier A2 is grounded through a resistor R5 and is also coupled to the gain control voltage input 28 through resistor R4. Resistors R4 and R5 are also coupled to each other at junction point 23. Operational amplifier A3 may typically be a LM101A type operational amplifier available commercially from National Semiconductor Corporation although other types may be used, and it has its input negative terminal coupled to resistor R8 which is also coupled to the output of operational amplifier A2 at junction point 33. Feedback resistor R10 of operational amplifier A3 is coupled to the negative input terminal and also to the output terminal of operational amplifier A3 at junction points 25 and 26 respectively. Operational amplifier A3 also has its positive input terminal coupled to calibration point 29 via calibration resistor R9. Resistor R9 is also coupled to resistor R5 via junction points 23 and 24. Resistor R4 is a calibrating resistor which can be utilized to change the slope of the gain (in db) versus AGC voltage characteristic curve to compensate for the temperature of the oven in the $\mu$ A726. Resistor R9 may be used to calibrate the height of the curve of the gain (in db) versus AGC voltage characteristic to offset tolerance variations and semiconductor offsets.

Operational amplifier A4 may be an LM107 type sold commercially by National Semiconductor Corporation although other types available from other manufacturers may also be used, and it has its negative input terminal coupled to the output terminal of operational amplifier A3 via resistor R11. The positive terminal of operational amplifier A4 is grounded. A capacitor C3 is coupled to the negative input terminal and to the output terminal of operational amplifier A4. This configuration makes operational amplifier A4 function as an integrator. The output terminal of operational amplifier A4 is also coupled to the gate of FET transistor Q3. The source of FET transistor Q3 is coupled to a plus 12 volt supply through resistor R2, and it is also coupled to the cathode of zener diode D1. The drain of FET transistor Q3 is coupled to the base of transistor Q1 and also to the negative terminal of amplifier A1. Capacitors C1 and C2 are connected from pin 1 to pin 8 of their respective operational amplifiers in accordance with the manufacturer's recommendations to prevent oscillations. If LM107's are used the capacitors are already inside of the amplifiers so no external capacitors are needed there. Pins 5, 6, and 8 of the $\mu$ A726 (device 100) are connected in accordance with the manufacturer's recommendations for operating the temperature control circuitry of the $\mu$ A726 device. R3, the 274K resistor to pin 6 sets the operating temperature.

Below are tables I and II. Table I sets forth the typical values of the components of the circuit although other component values having a proper relationship one with the other may be used. Table II gives typical component types, available commercially that may be utilized in the invention, although other types such as electron tubes, for example, in place of semiconductors may be used.

TABLE I

MAGNITUDE OF COMPONENTS

| Component Identification | Magnitude | Units |
|---|---|---|
| R1 | 357 | Kilohms |
| R2 | 1.18 | Kilohms |
| R3 | 274 | Kilohms |
| R4 | Selected 10 value typical | Kilohms |
| R5 | 59 | Ohms |
| R6 | 600 | Kilohms |
| R7 | 24.9 | Kilohms |
| R8 | 24.9 | Kilohms |
| R9 | Selected value typically omitted | Megohms |
| R10 | 1 | Megohms |
| R11 | 1 | Megohms |
| C1 | 6 | pf. |
| C2 | 6 | pf. |
| C3 | 1 | $\mu$fd. |

TABLE II

TYPE OF COMPONENTS

| Component Identification | Type | Manufacturer |
|---|---|---|
| A1, A4 | LM107 | National Semiconductor |
| A2, A3 | LM101A | National Semiconductor |
| 100 | $\mu$ A726 | Fairchild Semiconductor |
| Q3 | 2N5116 | Union Carbide Fairchild Semiconductor |
| D1 | 6.8 Volt Zener diode | common item |

OPERATION OF THE PREFERRED EMBODIMENT

Amplifier A1 causes the current through the emitter of equivalent diode Q1 to equal $E_{in}/R1$ amps (where $E_{in}$ is the AC voltage input signal) plus the bias current through FET transistor Q3. The base 2 of the equivalent diode Q1 is kept essentially at ground potential by amplifier A1 since the voltage of its inverting minus terminal is maintained equal to that of its non-inverting plus terminal and this terminal is grounded; hence the emitter to ground voltages of effective diodes Q1 and Q2 vary proportionally to the log of the bias plus the input voltage. Also, amplifier A2 keeps the base 1 of effective diode Q2 at a constant voltage which is proportional to the applied "AGC control voltage" applied at gain-control-voltage point 28; it does this by virtue of the fact that the minus inverting terminal and the plus non-inverting terminal of amplifier A2 are maintained at essentially equal voltages; and since the AGC signal is applied to the plus terminal it is in effect also applied to the minus terminal of amplifier A2. Therefore by adjusting the voltage of the positive non-inverting terminal, the voltage of the negative inverting terminal of amplifier A2 is adjusted and thus the voltage on the base 1 of the equivalent diode Q2 is adjusted. Thus the voltage across the emitter to base of effective diode Q2 is proportional to the AGC voltage plus the log of the sum of the input bias and the input signal amplitudes. Now since the current through the base emitter junction of effective diode Q2 varies proportionally with the anti-logarithm of the voltage, the current is proportional to the sum of the input bias and signal amplitude times the antilogarithm of the AGC voltage. (Adding the logs of numbers is equivalent to multiplication.) In this particular embodiment resistors R4 and R5 are chosen as per Table I above, although other values may be used, and for every 10 volts applied to resistor R4 to the voltage at the non-inverting terminal of the amplifier A2 is charged by by the AGC, approximately 60 millivolts will be provided for adjusting the gain of the amplifier. Conversely adding 60 millivolts to the voltage across effective diode Q2 changes the gain of amplifier A2 by approximately 20 db which is a factor of 10. So far, it is seen that the a-c output current of effective diode Q2 is proportional to the input signal $E_{in}$ times a constant which is adjustable by adjusting the gain control voltage. To make a useful variable gain amplifier it is necessary to convert the current back into a voltage, and provide a means of keeping diodes Q1 and Q2 forward biased, since the applied input signal is a-c and could cut off diodes Q1 and Q2 if the signal swings negative. Referring to FIG. 1 it is seen that the current out of diode Q2 is applied to the minus input terminal of amplifier A2; however, since operational amplifier A2 has essentially infinite input impedance not much current will go through the amplifier A2, also since resistor R6 is about 600 Kilohms (see Table I) and there is no a-c voltage across R6, essentially no a-c current will go through the R6 resistor. Therefore, essentially all of the a-c current will go through the R7 feedback resistor which in this embodiment is only 24.9 Kilohms. Therefore operational amplifier A2 works to keep its inverting negative input pin at a constant d-c potential and to develop an alternating current that is equal to the signal going through feedback resistor R7. This provides the output voltage which is proportional to the input voltage times the constant. Since resistor R8 has the same magnitude as resistor R7 (see Table I) the voltage is converted back to current of the original magnitude which is further reconverted to voltage by resistor R10. Hence the voltage output $E_{out}$ of the variable gain amplifier is a signal which is proportional to the input voltage times an adjustable constant.

To maintain the above described relationship, effective diodes Q1 and Q2 must always be forward biased and not be allowed to cutoff regardless of a-c signal variations. To do this, a positive bias must be added that is sufficient to overcome the largest negative signal swing. Therefore it is first necessary to know the largest negative signal swing. This knowledge is obtained by applying enough AGC voltage to give a desired standard size output signal. Then all that is required is to add sufficient voltage to overcome this maximum standard size signal. The required bias is added as a current into the output diode Q2 through resistor R6, through the 12 volt supply and resistor R2 which is clamped to a fixed voltage (6.8 volts) by Zener diode D1. It can be seen therefore that the output voltage of diode Q2 at its pin 1 will never go below zero and will never cut off unless $E_{out}$ exceeds approximately volts peak amplitude.

Now it is also necessary to ascertain that diode Q1 is also always forward biased no matter what the gain is and does not cut off. This is accomplished by FET transistor Q3 whose gate is supplied with a variable d-c voltage by integrator A4 to drive the gate of the FET thus varying the FET drain current and thus varying the input bias current supplied to equivalent diode Q1. It will be noted from FIG. 1 that the current through the base to emitter junction of diode Q2, which hereinbefore has been shown to be proportional to the sum of the input bias and signal amplitude times the antilogarithm of the AGC voltage, is subtracted at node 21 from the fixed bias current supplied through resistor R6, and the difference current is drawn from resistor R7, the feedback resistor of amplifier A2. The signal is so small at this point that two amplifiers A2 and A3 are utilized to obtain a gain-bandwidth product large enough to assure dependable high frequency operation. These two operational amplifiers cause a current to flow through feedback resistor R10 which is essentially equal to the magnitude of the current in the R6 resistor minus the current in the emitter 10 of transistor Q2. This offset current is once again converted to a voltage at feedback resistor R10, and is integrated by amplifier A4 and its associated circuitry and utilized to adjust the constant-current field effect transistor Q3 to cancel any d-c offset at the output.

In a typical application, the AGC voltage is controlled to keep the output signal level below the saturation level. Therefore, the signal level will not exceed the bias level at the output stage. Since the bias and the signal are both amplified the same amount, keeping the signal below the bias level at the output assures that the signal will be smaller than the bias level at the input to diode Q1 also. The result of this feedback bias adjustment system is that as the AGC control is adjusted to hold the output signal amplitude constant, the input bias level is automatically adjusted to be proportional to the input signal amplitude.

If component tolerance variations and semiconductor offsets cause the gain (in db) versus AGC voltage characteristic to differ from the ideal straight line, the height of the line can be adjusted by changing resistor R9, and the slope can be adjusted by changing resistor R4. No adjustment is required for linearity. The temperature of equivalent diode pair 100 is set by resistor R3 connected from pin 6 to the plus 12 volt supply, and may be changed for different applications. If the diode pair 100 is replaced by a non-temperature-controlled matched pair the slope of the log-gain versus control voltage characteristics will be proportional to the absolute temperature of that pair.

Having shown and described one embodiment of the invention, those skilled in the art will realize that many variations and modifications can be made to produce the described invention and still be within the spirit and scope of the claimed invention.

What is claimed is:

1. A precision variable gain amplifier with substantially linear log-gain versus control voltage characteristic comprising:

a. diode means for processing electronic signals therein;

b. first bias means coupled to said diode means, said first bias means for providing to said diode means a first bias voltage proportional to an automatic-gain-controlled (AGC) voltage;

c. second bias means coupled to said diode means, said second bias means for providing to said diode means a second bias current proportional to an input signal voltage level; and, d. amplifier means coupled to said diode means and to said first and second bias means for amplifying the input signal voltage level.

2. A precision variable gain amplifier as recited in claim 1 wherein said diode means comprise at least two semiconductor diodes parallel coupled to each other each semiconductor diode having a forward voltage versus current characteristic curve wherein the voltage is proportional to the log of the current.

3. A precision variable gain amplifier as recited in claim 1 wherein said diode means comprise at least two transistors each transistor having its base coupled to its collector, said transistors also having their emitters coupled to each other.

4. A precision variable gain amplifier as recited in claim 3 wherein said transistors each has an emitter-base forward voltage versus current characteristic curve wherein the voltage is proportional to the log of the current and including adding means coupled to the emitters of said diode means, said adding means for adding an input voltage signal to a second bias voltage signal and applying the sum to said diode means.

5. A precision variable gain amplifier as recited in claim 4 wherein the first bias voltage is applied to one of said transistors and the second bias current is applied to another of said transistors.

6. A precision variable gain amplifier as recited in claim 5 including signal input means coupled to said precision amplifier for applying an electric signal to said precision variable gain amplifier, and further including signal output means also coupled to said precision amplifier for abstracting an amplified electric signal from said precision variable gain amplifier.

7. A precision variable gain amplifier as recited in claim 6 including subtracting means coupled to said first bias means and to said diode means, said subtracting means for subtracting the processed electronic signal from the first bias.

8. A precision variable gain amplifier as recited in claim 7 including feedback means coupled to said signal subtracting means and to said diode means said feedback means for applying the subtracted signal to said diode means, said feedback means further including integrating means for integrating the subtracted processed electronic signal providing a variable DC signal.

9. A precision variable gain amplifier as recited in claim 8 including current varying means coupled to said diode means and to said feedback means for varying in response to the voltage magnitude of the subtracted signal the second bias current, and applying said varied second bias current to said diode means.

10. A precision variable gain amplifier as recited in claim 9 wherein said current varying means is a zener diode.

11. A precision variable gain amplifier with substantially linear log-gain versus control voltage characteristic comprising:

a. equivalent diode means, comprised of a transistor pair, each transistor of said transistor pair having its base coupled to its collector, said transistor pair also having their emitters coupled together, said equivalent diode means for processing electronic signals therein;

b. signal input means coupled to said equivalent diode means for applying an electric signal to said equivalent diode means;
c. first bias means coupled to said equivalent diode means for applying to said equivalent diode means a first bias voltage proportional to an automatic-gain-controlled (AGC) voltage;
d. second bias means coupled to said equivalent diode means for providing to said equivalent diode means a second bias current proportional to the input signal voltage level;
e. subtracting means coupled to said equivalent diode means and to said first bias means for subtracting the processed input electronic signal and the processed second bias from the first bias;
f. operational amplifier means coupled to said subtracting means, said operational amplifier means for amplifying the subtracted electronic signal;
g. signal output means coupled to said operational amplifier means for abstracting the amplified subtracted electronic signal;
h. feedback means coupled to said signal output means, and to said equivalent diode means said feedback means for applying a current responsive to the amplified subtracted electronic signal to said equivalent diode means.

12. A precision variable gain amplifier as recited in claim 11 including integrator means coupled to said output means and said equivalent diode means for integrating the amplified subtracted electronic signal.

13. A precision variable gain amplifier as recited in claim 12 including current varying means coupled to said integrator means and to said equivalent diode means, said current varying means responsive to said integrator means for varying the second bias.

14. A precision variable gain amplifier as recited in claim 13 wherein said current varying means is a zener diode.

15. An electric biasing network for biasing an equivalent diode, such that an AC voltage signal applied to the equivalent diode will always operate on the positive portion of the voltage-current characteristic curve of the equivalent diode comprising:
a. first biasing means coupled to said equivalent diode, said first biasing means responsive to an AGC (automatic-gain-controlled) voltage for applying a first bias voltage to said equivalent diode which first bias voltage is proportional to the AGC voltage;
b. second biasing means coupled to said equivalent diode means for providing to said diode means a second bias current proportional to the applied AC signal voltage;
c. subtraction means coupled to said equivalent diode means and to said first biasing means said subtraction means for subtracting from the first bias the AC signal voltage after the AC signal voltage has been processed through said equivalent diode means; and
d. current varying means coupled to said subtracting means and to said diode means, said current varying means responsive to said subtracting means for varying the second bias current in response to the subtracted voltage signal.

16. An electric biasing network as recited in claim 15 wherein the characteristic curve of the AGC voltage versus gain in db is a straight line.

17. An electric biasing network as recited in claim 16 including slope-adjusting means for varying the slope of the characteristic curve.

18. An electric biasing network as recited in claim 17 including height adjusting means for adjusting the height of the characteristic curve.

19. A method for providing an automatically adjusted input diode bias current proportional to the nominal input signal level comprising:
a. applying an input bias current and input signal current to an electronic circuit means;
b. applying an output bias voltage to said electronic circuit means, said output bias voltage proportional to an automatic-gain-control voltage (AGC);
c. converting said input bias current and input signal current to signal voltages each of said signal voltages proportional to the logrithm of the input bias current and input signal current respectively;
d. combining said converted voltage signals;
e. multiplying said combined voltages by a constant which is adjustable by the AGC voltage;
f. converting said multiplied combined voltages into current;
g. subtracting from the output bias current said multiplied combined converted current;
h. converting said subtracted current to a difference voltage;
i. amplifying said converted difference voltage.

20. A method as recited in claim 19 including the further step of integrating said difference voltage and varying the input bias current in response to said difference voltage.

* * * * *